(12) United States Patent
Cao

(10) Patent No.: US 9,960,761 B2
(45) Date of Patent: May 1, 2018

(54) THIN FILM TRANSISTOR GATE VOLTAGE SUPPLY CIRCUIT

(71) Applicant: Shenzhen China Star Optoelectronics Technology Co., Ltd., Shenzhen, Guangdong (CN)

(72) Inventor: Dan Cao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 183 days.

(21) Appl. No.: 14/916,981

(22) PCT Filed: Jan. 6, 2016

(86) PCT No.: PCT/CN2016/070314
§ 371 (c)(1),
(2) Date: Mar. 4, 2016

(87) PCT Pub. No.: WO2017/101181
PCT Pub. Date: Jun. 22, 2017

(65) Prior Publication Data
US 2017/0302264 A1    Oct. 19, 2017

(30) Foreign Application Priority Data

Dec. 14, 2015 (CN) .......................... 2015 1 0925798

(51) Int. Cl.
*H03K 17/14* (2006.01)
*H03K 19/20* (2006.01)
*G09G 3/36* (2006.01)

(52) U.S. Cl.
CPC ......... *H03K 17/145* (2013.01); *G09G 3/3648* (2013.01); *G09G 3/3696* (2013.01);
(Continued)

(58) Field of Classification Search
CPC ..................................................... H03K 17/14
See application file for complete search history.

(56) References Cited

U.S. PATENT DOCUMENTS 7,859,511 B2 * 12/2010 Shen .................... G09G 3/3696
345/101
9,768,754 B2 * 9/2017 Wang .................... H03K 3/012
2008/0309608 A1   12/2008 Shen et al.

FOREIGN PATENT DOCUMENTS

CN        102005197 A      4/2011
CN        102982778 A      3/2013
(Continued)

*Primary Examiner* — Hai L Nguyen
(74) *Attorney, Agent, or Firm* — Andrew C. Cheng

(57) ABSTRACT

The present invention provides a thin film transistor gate voltage supply circuit, and the thin film transistor gate voltage supply circuit is employed to supply a gate voltage for a thin film transistor, and the thin film transistor gate voltage supply circuit comprises a voltage generation circuit and a temperature compensation circuit, and the voltage generation circuit is employed to generate an original voltage, and the temperature compensation circuit is electrically coupled to the voltage generation circuit, and the temperature compensation circuit is employed to detect an ambient temperature, and as the ambient temperature is smaller than a preset temperature, the temperature compensation circuit compensates the original voltage according to a difference value of the ambient temperature and the preset temperature to obtain a first voltage, and supplies the first voltage to a gate of the thin film transistor to drive the thin film transistor normally work.

8 Claims, 2 Drawing Sheets

(52) U.S. Cl.
CPC ..... *H03K 19/20* (2013.01); *G09G 2310/0289* (2013.01); *G09G 2310/08* (2013.01); *G09G 2320/041* (2013.01)

(56) References Cited

FOREIGN PATENT DOCUMENTS

| | | |
|---|---|---|
| CN | 203456073 U | 2/2014 |
| CN | 104036740 A | 9/2014 |
| JP | 2007072270 A | 3/2007 |

* cited by examiner

THIN FILM TRANSISTOR GATE VOLTAGE SUPPLY CIRCUIT

CROSS REFERENCE

This application claims the priority of Chinese Patent Application No. 201510925798.5, entitled "Thin film transistor gate voltage supply circuit", filed on Dec. 14, 2015, the disclosure of which is incorporated herein by reference in its entirety.

FIELD OF THE INVENTION

The present invention relates to a display field, and more particularly to a thin film transistor gate voltage supply circuit.

BACKGROUND OF THE INVENTION

With the development of the display technology, the liquid crystal display (LCD) possesses properties of small volume and low power consumption. Therefore, it has been favored by the users. The Gate Driver on Array (GOA) technology is directly to manufacture the gate driver circuit or the gate driver IC on the Thin Film Transistor Array (TFT Array) to replace the externally connected driver IC which is manufactured with the CMOS. In the GOA technology, the driver IC can be directly manufactured at the periphery of the display panel. The manufacture procedures are less, and the production cost is lower. Moreover, the integration of the TFT-LCD display panel is higher so that the display panel can be thinner. The thin film transistor gate voltage supply circuit according to prior art generally supplies the voltage VGH with a fixed value to the gate of the thin film transistor for driving the thin film transistor to work. However, the drift of the threshold voltage VTH between the gate and the source of the thin film transistor along with the temperature is relatively larger. As the ambient temperature is lower than the preset temperature (such as −10° C.), the variation of the VTH of the thin film transistor is larger. In low temperature condition, as the thin film transistor gate voltage supply circuit according to prior art generally supplies the fixed voltage VGH to the gate of the thin film transistor, which can lead to that the VGH is smaller than VTH. Consequently, the thin film transistor cannot normally work, and ultimately the display panel cannot normally display.

SUMMARY OF THE INVENTION

The present invention provides a thin film transistor gate voltage supply circuit, and the thin film transistor gate voltage supply circuit is employed to supply a gate voltage for a thin film transistor, and the thin film transistor gate voltage supply circuit comprises a voltage generation circuit and a temperature compensation circuit, and the voltage generation circuit is employed to generate an original voltage, and the temperature compensation circuit is electrically coupled to the voltage generation circuit, and the temperature compensation circuit is employed to detect an ambient temperature, and as the ambient temperature is smaller than a preset temperature, the temperature compensation circuit compensates the original voltage according to a difference value of the ambient temperature and the preset temperature to obtain a first voltage, and supplies the first voltage to a gate of the thin film transistor to drive the thin film transistor normally work.

The temperature compensation circuit comprises a temperature detection unit, a control unit and a voltage adjustment unit, and the temperature detection unit is employed to detect the ambient temperature, and the control unit is electrically coupled to the temperature detection unit, and the control unit is employed to send a control signal as the ambient temperature is smaller than a preset temperature, and the voltage adjustment unit is electrically coupled to the control unit, and the voltage adjustment unit is employed to receive the control signal, and is conducted under control of the control signal to compensate the original voltage to obtain the first voltage.

The control unit comprises a time controller, a first detection circuit, a logic circuit, a timer and a selector, and the time controller is employed to receive the ambient temperature, and to compare the ambient temperature with the preset temperature to generate a time control signal and a first logic signal according to the difference value of the ambient temperature and the preset temperature, and the first detection circuit detects whether the voltage generation circuit works or not, and outputs a second logic signal, and the logic circuit receives the first logic signal and the second logic signal, and outputs a third logic signal according to the first logic signal and the second logic signal, and the timer receives the time control signal and the third logic signal, and the third logic signal is employed to control the timer to be on or off, and as the timer is on under the control of the third logic signal, the time control signal is employed to control a duration that the timer is on, and the time control signal controls the duration that the timer is on to be correlated with the difference, which the ambient temperature is smaller than the preset temperature, and the timer is also employed to send a select signal, and as the timer is on, the select signal control the selector to select the third logic signal, and to send the control signal according to the third logic signal.

The control unit further comprises a first branch, and the first branch is employed to generate a fourth logic signal, wherein the fourth logic signal and the third logic signal are opposite, and as the third logic signal controls the timer to be off, the selector selects the fourth logic signal, and the fourth logic signal is employed to deactivate the voltage adjustment unit.

The first detection circuit comprises a first resistor, a second resistor and a first operational amplifier, and one end of the first resistor is electrically coupled to the voltage generation circuit, and the other end of the first resistor is grounded through the second resistor, and a positive electrode of the first operational amplifier is coupled to a node between the first resistor and the second resistor, and an output end of the first operational amplifier is employed to be an output end of the first detection circuit, and as the voltage generation circuit works, the second logic signal is a high voltage level signal, otherwise, as the voltage generation circuit does not work, the second logic signal is a low voltage level signal.

As the ambient temperature is smaller than the preset temperature, the first logic signal is a high voltage level signal, and the logic circuit is an AND gate, and the logic circuit comprises a first logic signal receiving end, a second logic signal receiving end and a logic signal output end, and the first logic signal receiving end is employed to receive the first logic signal, and the second logic signal receiving end is employed to receive the second logic signal, and the logic signal output end is employed to output the third logic signal, and as the first logic signal is the high voltage level signal and the second logic signal is the high voltage level signal, the third logic signal is the high voltage level.

The timer comprises a first input end, a second input end and an output end, and the first input end is coupled to the logic signal output end to receive the third logic signal, and the second input end is coupled to an output end of the time controller to receive the time control signal; the selector is a two-to-one selector, and the selector comprises a first end, a second end, a third end and a fourth end, and the first end is electrically coupled to the logic signal output end to receive the third logic signal, and the second end is electrically coupled to the first branch to receive the fourth logic signal, and the third end is electrically coupled to an output end of the timer to receive the select signal.

The first branch comprises a first voltage receiving end, a third resistor and a first thin film transistor, and the first voltage receiving end is employed to receive high level voltage, and the first thin film transistor comprises a first gate, a first source and a first drain, and one end of the third resistor is electrically coupled to the first voltage receiving end, and the other end of the third resistor is electrically coupled to the first drain, and a node between the third resistor and the first drain is electrically coupled to the second end, and the first source is grounded, and the first gate receives a first branch control signal, and as the first branch control signal is a high voltage level signal, the first source and the first drain are connected, and as the first branch control signal is a low voltage level signal, the first source and the first drain are disconnected.

The control unit further comprises a second branch, and the second branch comprises a photocoupler, a fourth resistor, a fifth resistor and a second operational amplifier, and the photocoupler comprises a first coupling input end, a second coupling input end, a first coupling output end, a second coupling output end, and the first coupling input end is electrically coupled to the output end of the voltage generation circuit, and the second coupling input end is employed to be the output end of the thin film transistor gate voltage supply circuit to output the first voltage, and the first coupling output end is grounded through the fourth resistor, and the second coupling output end receives a high level voltage through the fifth resistor, and a positive electrode of the second operational amplifier is coupled to a node between the fourth resistor and the first coupling output end, and the output end of the second operational amplifier is coupled to the first gate to output the first branch control signal.

The voltage generation circuit comprises a voltage generation chip, a sixth resistor and a seventh resistor, and the voltage generation chip generates the original voltage, and an output end of the voltage generation chip is electrically coupled to the sixth resistor and the seventh resistor and to the output end of the thin film transistor gate voltage supply circuit, and the voltage adjustment unit comprises a second thin film transistor and an eighth resistor, and the second thin film transistor comprises a second gate, a second source and a second drain, and the second gate is electrically coupled to the fourth end of the selector, and the second source is grounded, and the second drain is electrically coupled to a node between the sixth resistor and the seventh resistor through the eighth resistor.

Compared with prior art, the thin film transistor gate voltage supply circuit of the present invention comprises the voltage generation circuit and the temperature compensation circuit, and as the temperature compensation circuit detects that the ambient temperature is smaller than the preset temperature, the temperature compensation circuit compensates the original voltage generated by the voltage generation circuit according to the difference value of the ambient temperature and the preset temperature to obtain the first voltage, and thus, as the lower ambient temperature causes that the threshold voltage between the gate and the source of the thin film transistor drifts and becomes large, the first voltage which is increased in comparison with the original voltage still can satisfy the normal work requirement of the thin film transistor. Thus, the thin film transistor gate voltage supply circuit of the present invention still can drive the thin film transistor normally work in a low temperature environment.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
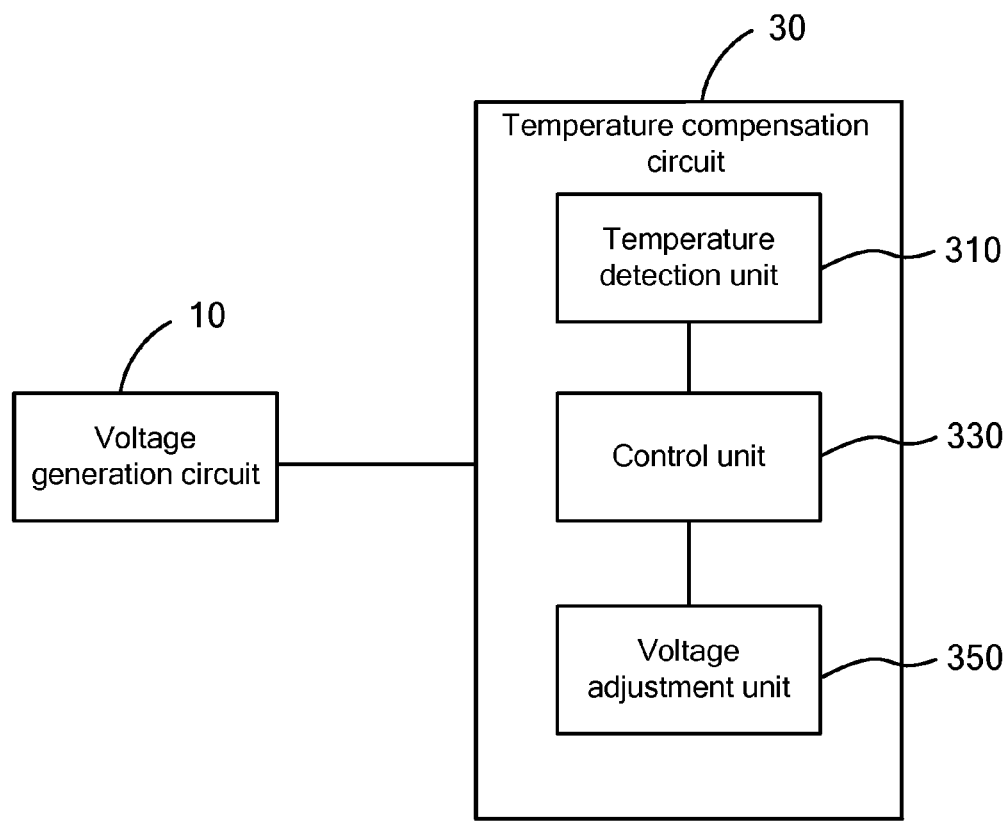
FIG. 1 is a circuit block diagram of a thin film transistor gate voltage supply circuit according to one preferred embodiment of the present invention.
Figure 2:
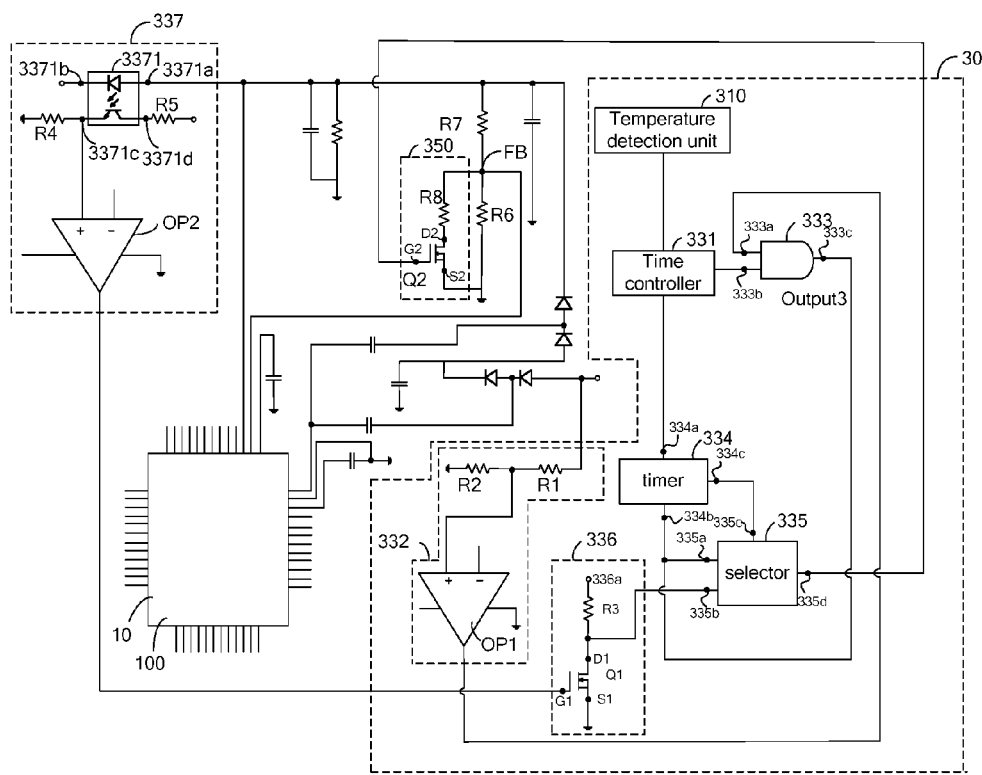
FIG. 2 is a structure diagram of a thin film transistor gate voltage supply circuit according to one preferred embodiment of the present invention.

Please refer to FIG. 1 and FIG. 2, together. FIG. 1 is a circuit block diagram of a thin film transistor gate voltage supply circuit according to one preferred embodiment of the present invention; FIG. 2 is a structure diagram of a thin film transistor gate voltage supply circuit according to one preferred embodiment of the present invention. The thin film transistor gate voltage supply circuit 1 is employed to supply a gate voltage for a thin film transistor. In this embodiment, the thin film transistor gate voltage supply circuit 1 is employed to provide the gate voltage for the thin film transistors in the thin film transistor array (TFT Array) in the liquid crystal display panel. The thin film transistor gate voltage supply circuit 1 comprises a voltage generation circuit 10 and a temperature compensation circuit 30, and the voltage generation circuit 10 is employed to generate an original voltage, and the temperature compensation circuit 30 is electrically coupled to the voltage generation circuit 10, and the temperature compensation circuit 30 is employed to detect an ambient temperature, and as the ambient temperature is smaller than a preset temperature, the temperature compensation circuit 30 compensates the original voltage according to a difference value of the ambient temperature and the preset temperature to obtain a first voltage, and supplies the first voltage to a gate of the thin film transistor to drive the thin film transistor normally work.

The temperature compensation circuit 30 comprises a temperature detection unit 310, a control unit 330 and a voltage adjustment unit 350. The temperature detection unit 310 is employed to detect the ambient temperature, and the control unit 330 is electrically coupled to the temperature detection unit 310, and the control unit 330 is employed to send a control signal as the ambient temperature is smaller than a preset temperature, and the voltage adjustment unit 350 is electrically coupled to the control unit 330, and the voltage adjustment unit 350 is employed to receive the control signal, and is conducted under control of the control signal to compensate the original voltage to obtain the first voltage.

In this embodiment, the temperature detection unit 310 is a temperature sensor.

The control unit 330 comprises a time controller 331, a first detection circuit 332, a logic circuit 333, a timer 334 and a selector 335. The time controller 331 is employed to receive the ambient temperature, and to compare the ambient temperature with the preset temperature to generate a time control signal and a first logic signal according to the difference value of the ambient temperature and the preset temperature. The first detection circuit 332 detects whether the voltage generation circuit 10 works or not, and outputs a second logic signal. The logic circuit 333 receives the first logic signal and the second logic signal, and outputs a third logic signal according to the first logic signal and the second logic signal. The timer 334 receives the time control signal and the third logic signal, and the third logic signal is employed to control the timer 334 to be on or off, and as the timer 334 is on under the control of the third logic signal, the time control signal is employed to control a duration that the timer 334 is on, and the time control signal controls the duration that the timer 334 is on to be correlated with the difference, which the ambient temperature is smaller than the preset temperature, and the timer 334 is also employed to send a select signal, and as the timer 334 is on, the select signal control the selector 335 to select the third logic signal, and to send the control signal according to the third logic signal.

The control unit 330 further comprises a first branch 336, and the first branch 336 is employed to generate a fourth logic signal, wherein the fourth logic signal and the third logic signal are opposite, and as the third logic signal controls the timer 334 to be off, the selector 335 selects the fourth logic signal, and the fourth logic signal is employed to deactivate the voltage adjustment unit 350. Here, the opposition of the fourth logic signal and the third logic signal means that the voltage level of the fourth logic signal and the voltage level of the third logic signal are opposite. For instance, as the third logic signal is high voltage level, the fourth logic signal is low voltage level. Because the time control signal controls the duration that the timer 334 is on, and as the on duration of the timer 334 is finished under control of the control signal, i.e. the timer 334 is off, the select signal controls the selector 335 to select the fourth logic signal.

The first detection circuit 332 comprises a first resistor R1, a second resistor R2 and a first operational amplifier OP1. One end of the first resistor R1 is electrically coupled to the voltage generation circuit 10, and the other end of the first resistor R1 is grounded through the second resistor R2. A positive electrode of the first operational amplifier OP1 is coupled to a node between the first resistor R1 and the second resistor R2, and an output end of the first operational amplifier OP1 is employed to be an output end of the first detection circuit 332, and as the voltage generation circuit 10 works, the second logic signal is a high voltage level signal, otherwise, as the voltage generation circuit 10 does not work, the second logic signal is a low voltage level signal.

As the ambient temperature is smaller than the preset temperature, the first logic signal is a high voltage level signal. The logic circuit 333 is an AND gate, and the logic circuit 333 comprises a first logic signal receiving end 333a, a second logic signal receiving end 333b and a logic signal output end 333c. The first logic signal receiving end 333a is employed to receive the first logic signal, and the second logic signal receiving end 333b is employed to receive the second logic signal, and the logic signal output end 333c is employed to output the third logic signal, and as the first logic signal is the high voltage level signal and the second logic signal is the high voltage level signal, the third logic signal is the high voltage level.

The timer 334 comprises a first input end 334a, a second input end 334b and an output end 334c. The first input end 334a is coupled to the logic signal output end 333c to receive the third logic signal. The second input end 334b is coupled to an output end of the time controller 331 to receive the time control signal. The selector 335 is a two-to-one selector, and the selector 335 comprises a first end 335a, a second end 335b, a third end 335c and a fourth end 335d. The first end 335a is electrically coupled to the logic signal output end 333c to receive the third logic signal, and the second end 335b is electrically coupled to the first branch 336 to receive the fourth logic signal, and the third end 335c is electrically coupled to an output end of the timer 334 to receive the select signal.

The first branch 336 comprises a first voltage receiving end 336a, a third resistor R3 and a first thin film transistor Q1. The first voltage receiving end 336a is employed to receive high level voltage, such as the +5V or +10V voltage, and the first thin film transistor Q1 comprises a first gate G1, a first source S1 and a first drain D1, and one end of the third resistor R3 is electrically coupled to the first voltage receiving end 336a, and the other end of the third resistor R3 is electrically coupled to the first drain D1, and a node between the third resistor R3 and the first drain D1 is electrically coupled to the second end 335b, and the node between the third resistor R3 and the first drain D1 is employed to be the output end of the first branch 336 to output the fourth logic signal, and the first source S1 is grounded, and the first gate G1 receives a first branch control signal, and as the first branch control signal is a high voltage level signal, the first source S1 and the first drain D1 are connected, and then the first thin film transistor Q1 is activated; as the first branch control signal is a low voltage level signal, the first source S1 and the first drain D1 are disconnected, and then the first thin film transistor Q1 is deactivated.

The control unit 330 further comprises a second branch 337, and the second branch 337 comprises a photocoupler 3371, a fourth resistor R4, a fifth resistor R5 and a second operational amplifier OP2. The photocoupler 3371 comprises a first coupling input end 3371a, a second coupling input end 3371b, a first coupling output end 3371c, a second coupling output end 3371d. The first coupling input end 3317a is electrically coupled to the output end of the voltage generation circuit 10, and the second coupling input end 3371b is employed to be the output end of the thin film transistor gate voltage supply circuit 1 to output the first voltage, and the first coupling output end 3371c is grounded through the fourth resistor R4, and the second coupling output end 3371d receives a high level voltage through the fifth resistor R5. A positive electrode of the second operational amplifier OP2 is coupled to a node between the fourth resistor R4 and the first coupling output end 3371c, and the output end of the second operational amplifier OP2 is coupled to the first gate G1 to output the first branch control signal.

In this embodiment, the voltage generation circuit 10 comprises a voltage generation chip 100, a sixth resistor R6 and a seventh resistor R7. The voltage generation chip 100 generates the original voltage, and an output end (i.e. voltage output end) of the voltage generation chip is electrically coupled to the sixth resistor R6 and the seventh resistor R7 and to the output end of the thin film transistor gate voltage supply circuit. The voltage adjustment unit 350 comprises a second thin film transistor Q2 and an eighth resistor R8, and the second thin film transistor Q2 comprises a second gate G2, a second source S2 and a second drain D2, and the second gate G2 is electrically coupled to the fourth end 335d of the selector 335, and the second source S2 is grounded, and the second drain D2 is electrically coupled to a node between the sixth resistor R6 and the seventh resistor R7 through the eighth resistor R8.

In this embodiment, as the time controller 331 compares the ambient temperature with the preset temperature, and the ambient temperature is smaller than the preset temperature, the first logic signal is a high voltage level signal, and as the ambient temperature is larger than or equal to the preset temperature, the first logic signal is a low voltage level signal. As the first detection circuit 332 detects that the voltage generation circuit 10 works, the first detection circuit 332 outputs the second logic signal of high voltage level, i.e. at this time, the second logic signal is high voltage level; as the first detection circuit 332 detects that the voltage generation circuit 10 does not work, the first detection circuit 332 outputs the second logic signal of low voltage level, i.e. at this time, the second logic signal is a low voltage level signal. The logic circuit 333 is an AND gate, and the first logic signal receiving end 333a receives the first logic signal, and the second logic signal receiving end 333b receives the second logic signal, and as the first logic signal is a high voltage level and the second logic signal is a high voltage level signal, the logic signal output end 333c outputs the third logic signal of high voltage level, i.e. at this time, the third logic signal is a high voltage level signal; otherwise, as the first logic signal and the second logic signal are not the high voltage level signals at the same time, the third logic signal is a low voltage level. As the timer 334 is on, the select signal control the selector 335 to select the third logic signal, and to send the control signal according to the third logic signal. As the third logic signal is a high voltage level signal, the control signal is the third logic signal, i.e. the control signal is high voltage level. The gate of the second thin film transistor Q2 in the voltage adjustment unit 350 receives the control signal of high voltage level, and controls the second source S2 and the second drain D2 to be connected under control of the control signal. Then, the eighth resistor R8 in the voltage adjustment unit 350 and the sixth resistor R6 in the voltage generation circuit 10 are coupled in parallel. For convenience, the node between the sixth resistor R6 and the seventh resistor R7 is marked as FB, and the voltage of the node FB is marked as VFB, and the voltage of the thin film transistor gate voltage supply circuit 1 is marked as VGHU. Then, VGHU=VFB*(R6//R8)/(R7+R6//R8), wherein R6//R8 represents the resistor after the R6 and R8 are coupled in parallel, and R6//R8=R6*R8/(R6+R8). Then, as the ambient temperature is smaller than the preset temperature, and due to the function of the temperature compensation circuit 30, the first voltage outputted by the thin film transistor gate voltage supply circuit 1 is VGHU. At the room temperature while the temperature compensation circuit 30 is not on, the first voltage outputted by the thin film transistor gate voltage supply circuit is VGHO=VFB*R6/(R6+R8). Thus, VGHU is larger than VGHO. The first voltage VGHU is larger than the threshold voltage VTH between the gate and the source of the thin film transistor, which results in that the thin film transistor can be normally activated, and ultimately, the display panel can normally display at the low temperature.

As the first voltage VGHU can make the thin film transistor normally work, the first branch control signal outputted by the second branch 337 can be high voltage level. The first gate G1 of the first thin film transistor Q1 in the first branch 336 receives the first branch control signal of high voltage level, and thus, the first source S1 and the first drain D1 are connected. Then, the voltage of the node between the third resistor R3 and the first drain D1 is the low level voltage, i.e. then, the fourth logic signal is a low voltage level signal. Because the time control signal controls the duration that the timer 334 is on, and as the on duration of the timer 334 is finished under control of the control signal, i.e. the timer 334 is off, the select signal controls the selector 335 to select the fourth logic signal. Because the fourth logic signal and the third logic signal are opposite, and then the selector 335 output s a low voltage level signal. Because the second gate G2 of the second thin film transistor Q2 in the voltage adjustment circuit 350 receives the low voltage level signal outputted by the selector 335, and controls the second source S2 and the second drain D2 to be disconnected, the voltage adjustment circuit 350 is deactivated. Then, the first voltage outputted by the thin film transistor gate voltage supply circuit 1 is equal to the original voltage. As the temperature detection unit 310 detects that the ambient temperature is lower than the preset temperature, again, the aforesaid process that the voltage adjustment circuit 350 is activated is repeated, again.

Compared with prior art, the thin film transistor gate voltage supply circuit 1 of the present invention comprises the voltage generation circuit 10 and the temperature compensation circuit 30, and as the temperature compensation circuit 30 detects that the ambient temperature is smaller than the preset temperature, the temperature compensation circuit compensates the original voltage generated by the voltage generation circuit 10 according to the difference value of the ambient temperature and the preset temperature to obtain the first voltage, and thus, as the lower ambient temperature causes that the threshold voltage between the gate and the source of the thin film transistor drifts and becomes large, the first voltage which is increased in comparison with the original voltage still can satisfy the normal work requirement of the thin film transistor. Thus, the thin film transistor gate voltage supply circuit 1 of the present invention still can drive the thin film transistor normally work in a low temperature environment.

Above are embodiments of the present invention, which does not limit the scope of the present invention. Any modifications, equivalent replacements or improvements within the spirit and principles of the embodiment described above should be covered by the protected scope of the invention.

What is claimed is:

1. A thin film transistor gate voltage supply circuit, wherein the thin film transistor gate voltage supply circuit is employed to supply a gate voltage for a thin film transistor, and the thin film transistor gate voltage supply circuit comprises a voltage generation circuit and a temperature compensation circuit, and the voltage generation circuit is employed to generate an original voltage, and the temperature compensation circuit is electrically coupled to the voltage generation circuit, and the temperature compensation circuit is employed to detect an ambient temperature, and as the ambient temperature is smaller than a preset temperature, the temperature compensation circuit compensates the original voltage according to a difference value of the ambient temperature and the preset temperature to obtain a first voltage, and supplies the first voltage to a gate of the thin film transistor to drive the thin film transistor normally work;

wherein the temperature compensation circuit comprises a temperature detection unit, a control unit and a voltage adjustment unit, and the temperature detection unit is employed to detect the ambient temperature, and the control unit is electrically coupled to the temperature detection unit, and the control unit is employed to send a control signal as the ambient temperature is smaller than the preset temperature, and the voltage adjustment unit is electrically coupled to the control unit, and the voltage adjustment unit is employed to receive the control signal, and is conducted under control of the control signal to compensate the original voltage to obtain the first voltage; and wherein the control unit comprises a time controller, a first detection circuit, a logic circuit, a timer and a selector, and the time controller is employed to receive the ambient temperature, and to compare the ambient temperature with the preset temperature to generate a time control signal and a first logic signal according to the difference value of the ambient temperature and the preset temperature, and the first detection circuit detects whether the voltage generation circuit works or not, and outputs a second logic signal, and the logic circuit receives the first logic signal and the second logic signal, and outputs a third logic signal according to the first logic signal and the second logic signal, and the timer receives the time control signal and the third logic signal, and the third logic signal is employed to control the timer to be on or off, and as the timer is on under the control of the third logic signal, the time control signal is employed to control a duration that the timer is on, and the time control signal controls the duration that the timer is on to be correlated with the difference, which the ambient temperature is smaller than the preset temperature, and the timer is also employed to send a select signal, and as the timer is on, the select signal control the selector to select the third logic signal, and to send the control signal according to the third logic signal.

2. The thin film transistor gate voltage supply circuit according to claim 1, wherein the control unit further comprises a first branch, and the first branch is employed to generate a fourth logic signal, wherein the fourth logic signal and the third logic signal are opposite, and as the third logic signal controls the timer to be off, the selector selects the fourth logic signal, and the fourth logic signal is employed to deactivate the voltage adjustment unit.

3. The thin film transistor gate voltage supply circuit according to claim 2, wherein the first detection circuit comprises a first resistor, a second resistor and a first operational amplifier, and one end of the first resistor is electrically coupled to the voltage generation circuit, and the other end of the first resistor is grounded through the second resistor, and a positive electrode of the first operational amplifier is coupled to a node between the first resistor and the second resistor, and an output end of the first operational amplifier is employed to be an output end of the first detection circuit, and as the voltage generation circuit works, the second logic signal is a high voltage level signal, otherwise, as the voltage generation circuit does not work, the second logic signal is a low voltage level signal.

4. The thin film transistor gate voltage supply circuit according to claim 3, wherein as the ambient temperature is smaller than the preset temperature, the first logic signal is a high voltage level signal, and the logic circuit is an AND gate, and the logic circuit comprises a first logic signal receiving end, a second logic signal receiving end and a logic signal output end, and the first logic signal receiving end is employed to receive the first logic signal, and the second logic signal receiving end is employed to receive the second logic signal, and the logic signal output end is employed to output the third logic signal, and as the first logic signal is the high voltage level signal and the second logic signal is the high voltage level signal, the third logic signal is the high voltage level.

5. The thin film transistor gate voltage supply circuit according to claim 4, wherein the timer comprises a first input end, a second input end and an output end, and the first input end is coupled to the logic signal output end to receive the third logic signal, and the second input end is coupled to an output end of the time controller to receive the time control signal; the selector is a two-to-one selector, and the selector comprises a first end, a second end, a third end and a fourth end, and the first end is electrically coupled to the logic signal output end to receive the third logic signal, and the second end is electrically coupled to the first branch to receive the fourth logic signal, and the third end is electrically coupled to an output end of the timer to receive the select signal.

6. The thin film transistor gate voltage supply circuit according to claim 5, wherein the first branch comprises a first voltage receiving end, a third resistor and a first thin film transistor, and the first voltage receiving end is employed to receive high level voltage, and the first thin film transistor comprises a first gate, a first source and a first drain, and one end of the third resistor is electrically coupled to the first voltage receiving end, and the other end of the third resistor is electrically coupled to the first drain, and a node between the third resistor and the first drain is electrically coupled to the second end, and the first source is grounded, and the first gate receives a first branch control signal, and as the first branch control signal is a high voltage level signal, the first source and the first drain are connected, and as the first branch control signal is a low voltage level signal, the first source and the first drain are disconnected.

7. The thin film transistor gate voltage supply circuit according to claim 6, wherein the control unit further comprises a second branch, and the second branch comprises a photocoupler, a fourth resistor, a fifth resistor and a second operational amplifier, and the photocoupler comprises a first coupling input end, a second coupling input end, a first coupling output end, a second coupling output end, and the first coupling input end is electrically coupled to the output end of the voltage generation circuit, and the second coupling input end is employed to be the output end of the thin film transistor gate voltage supply circuit to output the first voltage, and the first coupling output end is grounded through the fourth resistor, and the second coupling output end receives a high level voltage through the fifth resistor, and a positive electrode of the second operational amplifier is coupled to a node between the fourth resistor and the first coupling output end, and the output end of the second operational amplifier is coupled to the first gate to output the first branch control signal.

8. The thin film transistor gate voltage supply circuit according to claim 7, wherein the voltage generation circuit comprises a voltage generation chip, a sixth resistor and a seventh resistor, and the voltage generation chip generates the original voltage, and an output end of the voltage generation chip is electrically coupled to the sixth resistor and the seventh resistor and to the output end of the thin film transistor gate voltage supply circuit, and the voltage adjustment unit comprises a second thin film transistor and an eighth resistor, and the second thin film transistor comprises a second gate, a second source and a second drain, and the second gate is electrically coupled to the fourth end of the selector, and the second source is grounded, and the second drain is electrically coupled to a node between the sixth resistor and the seventh resistor through the eighth resistor.

* * * * *